US011894830B2

(12) United States Patent
Pham Colomban et al.

(10) Patent No.: US 11,894,830 B2
(45) Date of Patent: Feb. 6, 2024

(54) SURFACE ACOUSTIC WAVE DEVICE

(71) Applicants: THALES, COURBEVOIE (FR); CENTRE NATIONAL DE LA RECHERCHE SCIENTIFIQUE, Paris (FR); FREC'N'SYS, Besancon (FR); YNCREA HAUTS DE France ISEN LILLE, Lille (FR); UNIVERSITE DE LILLE, Lille (FR); ECOLE CENTRALE DE LILLE, Villeneuve D'Ascq (FR); UNIVERSITE POLYTECHNIQUE HAUTS-DE-FRANCE, Valenciennes (FR)

(72) Inventors: Thi Mai Pham Colomban, Palaiseau (FR); Claude Prévot, Palaiseau (FR); Paolo Martins, Palaiseau (FR); Anne-Christine Hladky-Hennion, Marcq en Baroeul (FR); Bertrand Dubus, Ronchin (FR); Marianne Sagnard, Besancon (FR); Thierry Laroche, Besancon (FR); Sylvain Ballandras, Besancon (FR); Charles Croenne, Lille (FR)

(73) Assignees: THALES, Courbevoie (FR); CENTRE NATIONAL DE LA RECHERCHE SCIENTIFIQUE, Paris (FR); SOITEC SA, Bernin (FR); YNCREA HAUTS DE FRANCE ISEN LILLE, Lille (FR); UNIVERSITE DE LILLE, Lille (FR); ECOLE CENTRALE DE LILLE, Villeneuve D'Asco (FR); UNIVERSITE POLYTECHNIQUE HAUTS-DE-FRANCE, Valenciennes (FR)

( * ) Notice: Subject to any disclaimer, the term of this patent is extended or adjusted under 35 U.S.C. 154(b) by 386 days.

(21) Appl. No.: 17/418,824

(22) PCT Filed: Dec. 27, 2019

(86) PCT No.: PCT/EP2019/087103
§ 371 (c)(1),
(2) Date: Jun. 27, 2021

(87) PCT Pub. No.: WO2020/136262
PCT Pub. Date: Jul. 2, 2020

(65) Prior Publication Data
US 2022/0060173 A1  Feb. 24, 2022

(30) Foreign Application Priority Data
Dec. 28, 2018 (FR) ...................................... 1874201

(51) Int. Cl.
H03H 9/145 (2006.01)
H03H 9/02 (2006.01)
H03H 9/64 (2006.01)

(52) U.S. Cl.
CPC .... *H03H 9/14502* (2013.01); *H03H 9/02637* (2013.01); *H03H 9/02992* (2013.01); *H03H 9/64* (2013.01)

(58) Field of Classification Search
CPC ........... H03H 9/14502; H03H 9/02637; H03H 9/02992; H03H 9/64
See application file for complete search history.

(56) References Cited

U.S. PATENT DOCUMENTS 6,291,924 B1    9/2001 Lau et al.
9,276,557 B1 *  3/2016 Nordquist ............ H03H 9/6403
(Continued)

FOREIGN PATENT DOCUMENTS

| EP | 0 415 063 A2 | 3/1991 |
| EP | 1 420 514 A1 | 5/2004 |
| JP | S52-105752 A | 9/1977 |

OTHER PUBLICATIONS

Yamanouchi, et al., "New Types of SAW Reflector and Resonator with Alternative (Positive and Negative) Reflection Coefficients", IEEE 1984 Ultrasonics Symposium, pp. 224-228, 1984.
(Continued)

*Primary Examiner* — Samuel S Outten
(74) *Attorney, Agent, or Firm* — BakerHostetler

(57) ABSTRACT

A surface acoustic wave device includes at least one transducer; two acoustic reflectors disposed on either side of the at least one transducer so as to form a cavity, each acoustic
(Continued)

reflector comprising an array of electrodes in the form of lines parallel with each other, each array comprising a subset of electrodes connected to a reference potential denoted mass defining a first connection type, and a subset of electrodes that are not connected to any potential, i.e. that have a floating connection defining a second connection type; at least one switching circuit configured to modify the distribution of the connections of at least one part of the electrodes of each array between the different connection types.

15 Claims, 14 Drawing Sheets

(56) References Cited

U.S. PATENT DOCUMENTS

| | | |
|---|---|---|
| 2009/0224854 A1 | 9/2009 | Ohkubo et al. |
| 2016/0134257 A1 | 5/2016 | Kare |
| 2018/0026605 A1 | 1/2018 | Ito et al. |

OTHER PUBLICATIONS

Reindl, et al., "Programmable reflectors for SAW-ID-tags", 1993 Proceedings IEEE Ultrasonics Symposium, p. 125, 1993.

* cited by examiner

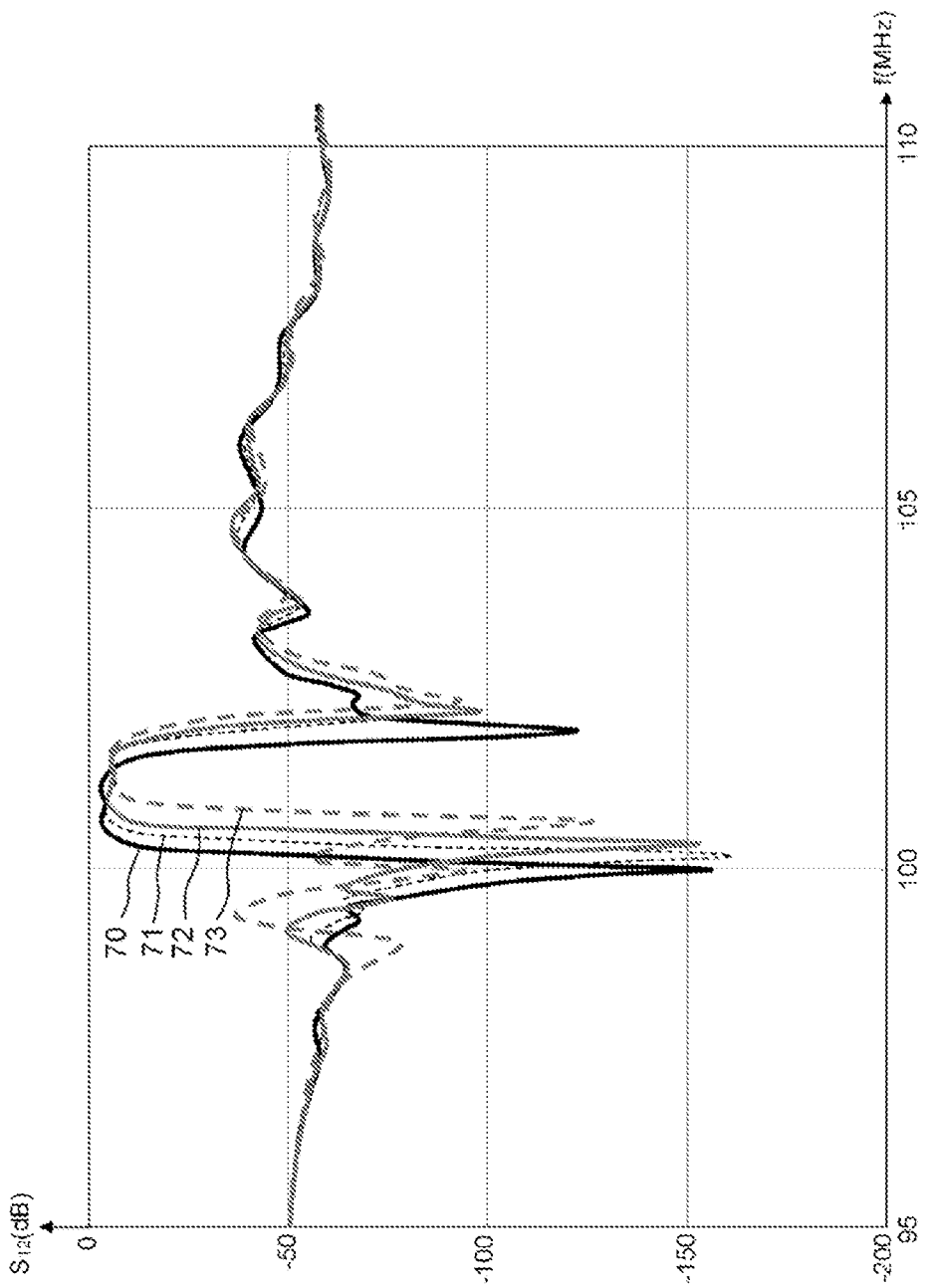

SURFACE ACOUSTIC WAVE DEVICE

CROSS-REFERENCE TO RELATED APPLICATIONS

This application is a National Stage of International patent application PCT/EP2019/087103, filed on Dec. 27, 2019, which claims priority to foreign French patent application No. FR 1874201, filed on Dec. 28, 2018, the disclosures of which are incorporated by reference in their entirety.

FIELD OF THE INVENTION

The invention relates to the field of components for telecommunications based on surface acoustic waves, called SAW. More particularly, the invention relates to frequency filters or feeds, and, according to an embodiment of the invention, frequency-agile filters and feeds.

BACKGROUND

In the context of telecommunications, a large number of radiofrequency (RF) bands are used in order to transmit or receive information. Each band defines a channel for which filtering functions are needed in order to store the information. There are therefore as many filters as there are RF bands and, to pass from one to another, switches are also necessary.

The feed domain also comprises a significant quantity of frequency bands that are addressed. Once again, an appropriate frequency feed needs to be associated with each band.

The SAW devices are widely used as filtering components in the field of telecommunications and in that of the feeds for producing oscillators. They have a spectral (or frequency) response defined by their design and their manufacture on the basis of their geometry and the materials used. When several frequency bands are addressed on one and the same device, each band is processed by a specific SAW component, which entails increasing the volume occupied and the cost.

Currently, there is no frequency agility. The frequency agility of the filtering devices or of the radiofrequency (RF) oscillators defines the capacity of these devices to have their operating frequency change as a function of parameters external or internal to the devices. This phenomenon is said to be controlled if the other figures of merit of the device are preserved when the parameters concerned change.

SAWs (Surface Acoustic Waves) are devices widely used in the field of components for telecommunications.

Generally, the operation of these devices is based on the conversion of electrical energy into at least one elastic wave via a transducer typically comprising two interdigital electrode combs deposited on the surface of a material that may or may not be piezoelectric. The reverse effect is also considered. The effectiveness of this conversion is directly linked to the intrinsic electromechanical coupling coefficient of the material and to the geometrical configuration of the electrodes of the transducer and to the nature of the metal of which they are composed.

A surface elastic wave device 20 is illustrated in FIG. 1. It comprises, first of all, one or more transducers (two transducers T1 and T2 in FIG. 1) allowing the mechanical vibratory phenomenon, also called acoustic wave, to be generated.

A SAW referred to as single-port SAW comprises a single transducer, one electrode comb being connected to the electrical input and the other comb being connected to the ground of the device. A SAW referred to as dual-port SAW as illustrated in FIG. 1 comprises two transducers T1 and T2, each comprising two combs P1, P1' and P2, P2'. The transducer T1 operates, for example, as input (excitation) with its comb P1 connected to the electrical input E and T2 operates as output, with its comb P2' connected to the electrical output S (recovery). The combs P1' and P2' are connected to the ground.

In a delay line configuration, the acoustic wave created is propagated freely on the surface of the material. In the resonator configuration that is of interest here illustrated in FIG. 1, the acoustic wave is trapped in a cavity through acoustic reflectors, that will hereinafter be called mirrors, placed on either side of the transducer or transducers.

The transducers can be glued or separated by a gap (space for free propagation of the wave) or an array of electrodes (called coupler).

The acoustic reflectors are Bragg mirrors disposed on either side of this transduction zone. They are formed by periodic arrays of electrodes R1 and R2 deposited on the surface of the same substrate Mat, and ensure a strong reflection coefficient for the surface acoustic waves within a certain range of frequencies, called stop band.

Typically, the electrodes of the mirrors take the form of rows 21 that are parallel to one another and distributed periodically according to a period p. The bar formed by each electrode 21 is characterized by geometrical parameters: a length l, a height h and a width a.

The geometrical parameters of the electrodes of the mirrors are identical or different from those of the electrodes of the transducers.

The electrodes of the mirrors are conventionally connected to the ground of the system, the connections being illustrated by the lines 22 in FIG. 1.

Preferentially, the electrodes are connected to the ground at both ends. This choice of a direct connection to the electrical ground allows a component to be obtained that is simple to produce, minimizing the spurious electrical effects at the electrodes and maximizing the general efficiency of the mirrors.

The different ground planes M are of course linked to one another, this link being symbolized by the dotted lines 23.

For the case of a filter, the mirrors form the resonant cavity within which one or more electroacoustic transducers generate and receive the elastic waves intended for the realization of the spectral function of the filter. Conventionally, the coefficient S11 is used to characterize the reflection of the filter PReflected/PIncident) and the coefficient S12 is used to characterized the transmission of the filter (PTransmitted/PIncident). These coefficients are calculated directly from the incident radiofrequency electrical signals, reflected and transmitted at the transducers. FIG. 1 illustrates the coefficients S11 and S12 characteristic of a bandpass filter. The operating frequency fR of such a device, also called nominal frequency of the filter, depends on numerous parameters including the material used for the substrate, the geometrical parameters defining the electrodes of the transducer or transducers and the electrodes of the mirrors, and the interaction between these various elements.

Moreover, to generate filters with specific characteristics, it is conventional practice to produce SAW arrangements from different elementary SAWs disposed in parallel and/or in series. FIG. 2 illustrates an example of ladder arrangement of a filter 30 based on a "cascade" of elementary single-port SAW resonators 20(1), 20(2) and 20(3) performing the filtering of a signal injected via the input 31 and recovered at the output 32.

The SAW resonators according to the state of the art have a response defined by their design and their manufacture. Thus, producing SAW filters/feeds with different nominal frequencies entails choosing filters that have different geometrical parameters. Furthermore, it is not possible to produce frequency-agile filters or oscillators.

SUMMARY OF THE INVENTION

The invention aims to overcome at least one of the abovementioned drawbacks by proposing a surface acoustic wave device that has a frequency behavior dependent on boundary conditions that can be modified without changing the geometrical parameters of the component, and that is frequency agile.

DESCRIPTION OF THE INVENTION

The subject of the present invention is a surface acoustic wave device comprising:
  at least one transducer,
  two acoustic reflectors disposed on either side of the at least one transducer so as to form a cavity, each acoustic reflector comprising an array of electrodes in the form of rows that are parallel to one another, each array comprising a subset of electrodes connected to a reference potential denoted ground defining a first type of connection, and a subset of electrodes which are not connected to any potential, that is to say which have a floating connection defining a second type of connection,
  at least one switching circuit (CCDM) configured to modify the distribution of the connections of at least a part of the electrodes of each array between the different types of connection.

Preferentially, the surface acoustic wave device according to the invention comprises one or two transducers.

According to a first variant, each electrode can have only the first or the second type of connection.

According to a second variant, the surface acoustic wave device according to the invention further comprises, for at least one subset of the electrodes of each mirror, an impedance between each of said electrodes of said subset and the ground, defining a third type of connection.

Preferentially, the distribution of the connections of the electrodes between the different types is symmetrical with respect to the at least one transducer.

According to one embodiment, connections of the electrodes are made individually for each array.

According to another embodiment, for each array, electrodes are linked to one another defining bunches, the connection being made per bunch.

According to one embodiment, for each array, a subset of neighboring electrodes disposed at one end of the array is connected to the ground.

According to one embodiment, which can be combined with the preceding embodiment, for each array, a subset of neighboring electrodes disposed at one end of the array has a floating connection.

According to one embodiment which can be combined with the preceding embodiments, for each array, electrodes form a periodic pattern, a pattern comprising at least one electrode connected to the ground and a floating electrode.

According to one embodiment, for each array, electrodes are linked individually to the switching circuit so that the modification of connection of said electrodes is applied individually.

According to another embodiment, for each array, electrodes are linked to one another to form bunches, each bunch being linked to the switching circuit so that the modification of connection of the electrodes is applied per bunch.

According to another aspect, the invention relates to a frequency filter comprising a surface acoustic wave device according to the invention.

Preferentially, the frequency filter comprises a plurality of surface acoustic wave devices according to the invention arranged in series and/or in parallel.

According to another aspect, the invention relates to an oscillator comprising an inverting circuit and a surface acoustic wave device according to the invention arranged in parallel with said inverting circuit, the surface acoustic wave device comprising two transducers.

The following description presents a number of exemplary embodiments of the device of the invention: these examples do not limit the scope of the invention. These exemplary embodiments present both the essential features of the invention and additional features linked to the embodiments considered. In the interests of clarity, the same elements will bear the same references in the different figures.

BRIEF DESCRIPTION OF THE DRAWINGS

The invention will be better understood and other features, aims and advantages thereof will become apparent from the following detailed description and in light of the attached drawings given by way of nonlimiting examples and in which:

FIG. 7b is illustrates the electrical coefficient S12 as a function of the frequency f of a complex filter in a ladder configuration with 3 devices according to the invention, for 4 connection configurations of the electrodes of the mirrors.

FIGS. 9a, 9b and 9c also illustrate different arrangements of the two types of connection CC and CO which can be combined together. In FIGS. 9a and 9b, for each array, a subset of neighboring electrodes disposed at the end of the array opposite the transducer is connected to the ground. In FIG. 9c, for each array, a plurality of successive electrodes shows an alternation of ground connection CC and floating connection CO.

DETAILED DESCRIPTION

Figure 3A:
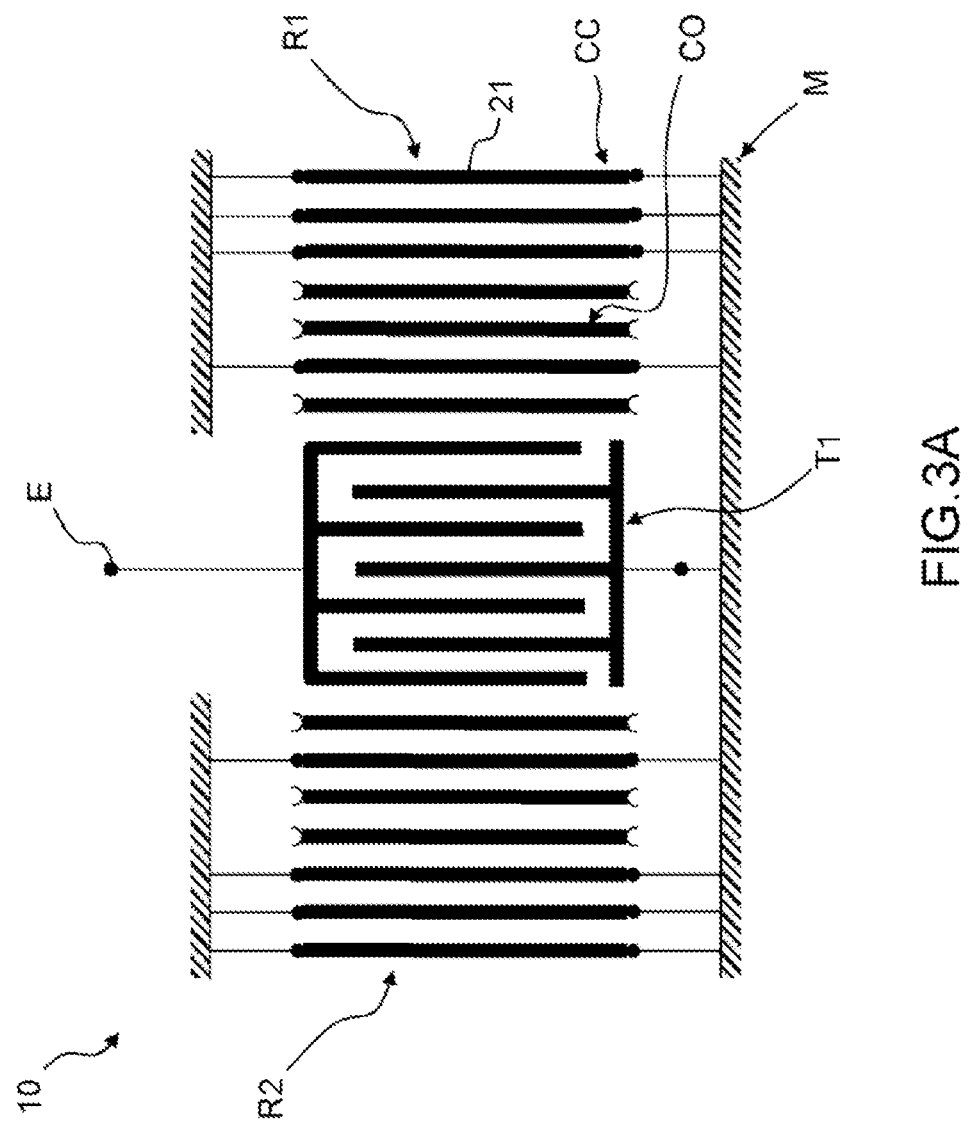
FIG. 3A illustrates the principle of a first variant of the surface acoustic wave device according to the invention.

The principle of the surface acoustic wave device 10 according to the invention is illustrated in FIG. 3. The device has a structure close to that of an SAW according to the state of the art, but in which the electrical boundary conditions of the mirrors have been modified.

Figure 1:
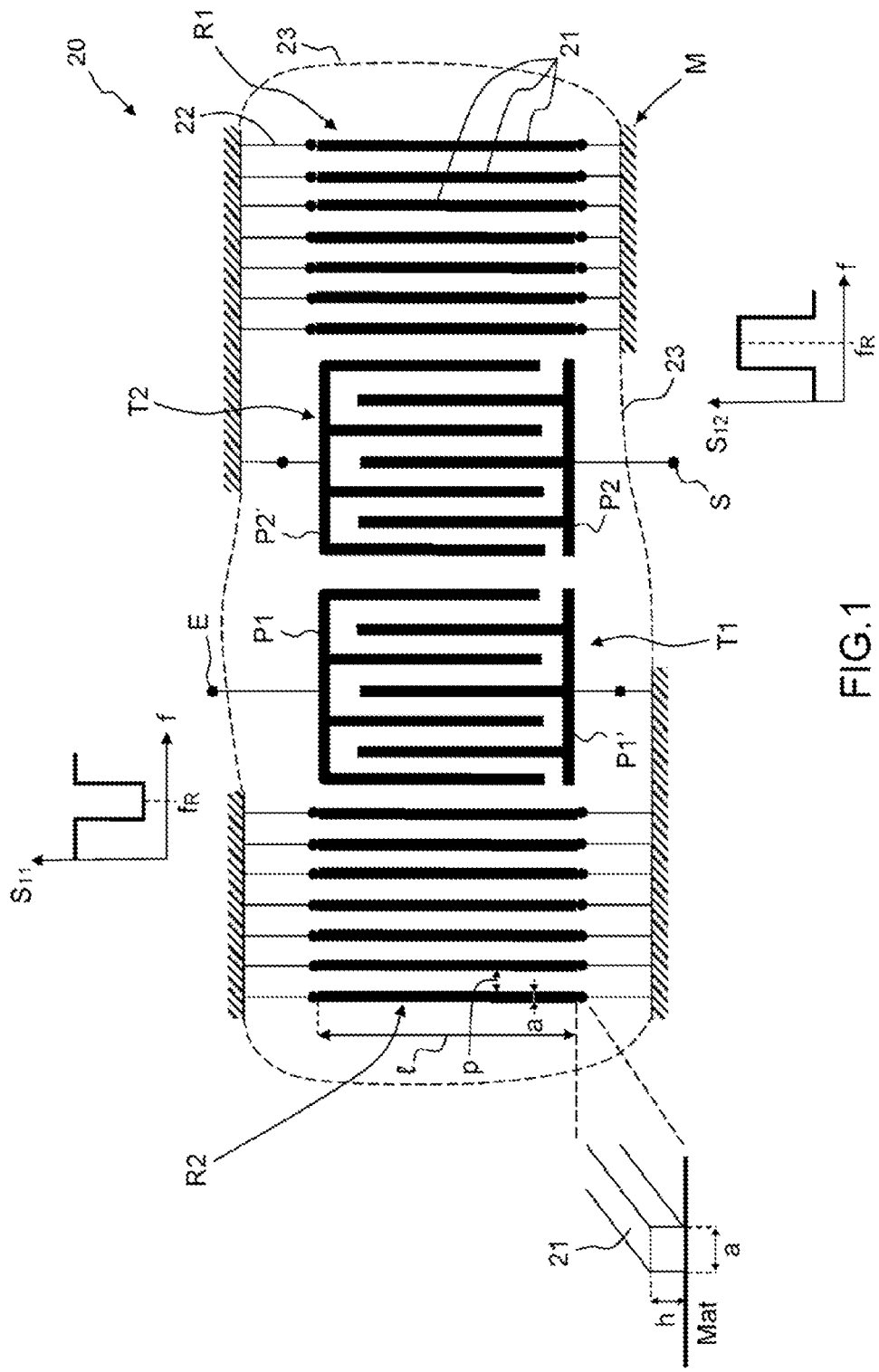
FIG. 1, already cited, illustrates a surface acoustic wave SAW device according to the state of the art.

The device 10 comprises at least one transducer. Preferentially, it comprises one of them (single-port SAW) or two of them (dual-port SAW). The nonlimiting FIG. 1 illustrates an SAW according to the invention that is a dual-port SAW with two transducers T1 and T2. The device 10 also comprises two acoustic reflectors disposed on either side of the at least one transducer so as to form a cavity, each acoustic reflector comprising an array of electrodes R1, R2 in the form of rows 21 that are parallel to one another.

Each array of electrodes comprises a subset of electrodes connected to a reference potential called ground M defining a first type of connection CC (short-circuit), and a subset of electrodes which are not connected to any potential, that is to say which have a floating connection defining a second type of connection CO (open-circuit), as illustrated in FIG. 3. The open-circuit (floating) connections are symbolized by the circular arcs at the ends of the electrodes. Thus, unlike the SAWs of the state of the art, certain electrodes of the device according to the invention have a connection of floating type.

FIG. 3 illustrates a first variant of the invention according to which each electrode can have only the first (CC) or the second (CO) type of connection.

The device 10 according to the invention further comprises at least one switching circuit CCDM configured to modify the distribution of the connections of at least a part of the electrodes of each array between the different types of connection. The possible reconfiguration of the connections dynamically confers frequency agility on the device according to the invention.

Thus, the electrical control of the frequency agility is obtained by virtue of the modification of the electrical boundary conditions in the mirrors. The concept of the invention considers modifying the electrical boundary conditions for each elementary electrode of the mirrors. Altogether, these modifications correspond to a distribution function within the mirror, fixed a priori or dynamically modifiable by virtue of a switching circuit. This distribution function allows the stop frequency band of the mirrors to be controlled and thus the resonance conditions of the standing waves inside the cavity to be modified.

The controlled frequency agility ensures the integrity of the figures of merit of the filter transposed to each new nominal frequency determined by the frequency agility phenomenon.

Figure 3B:
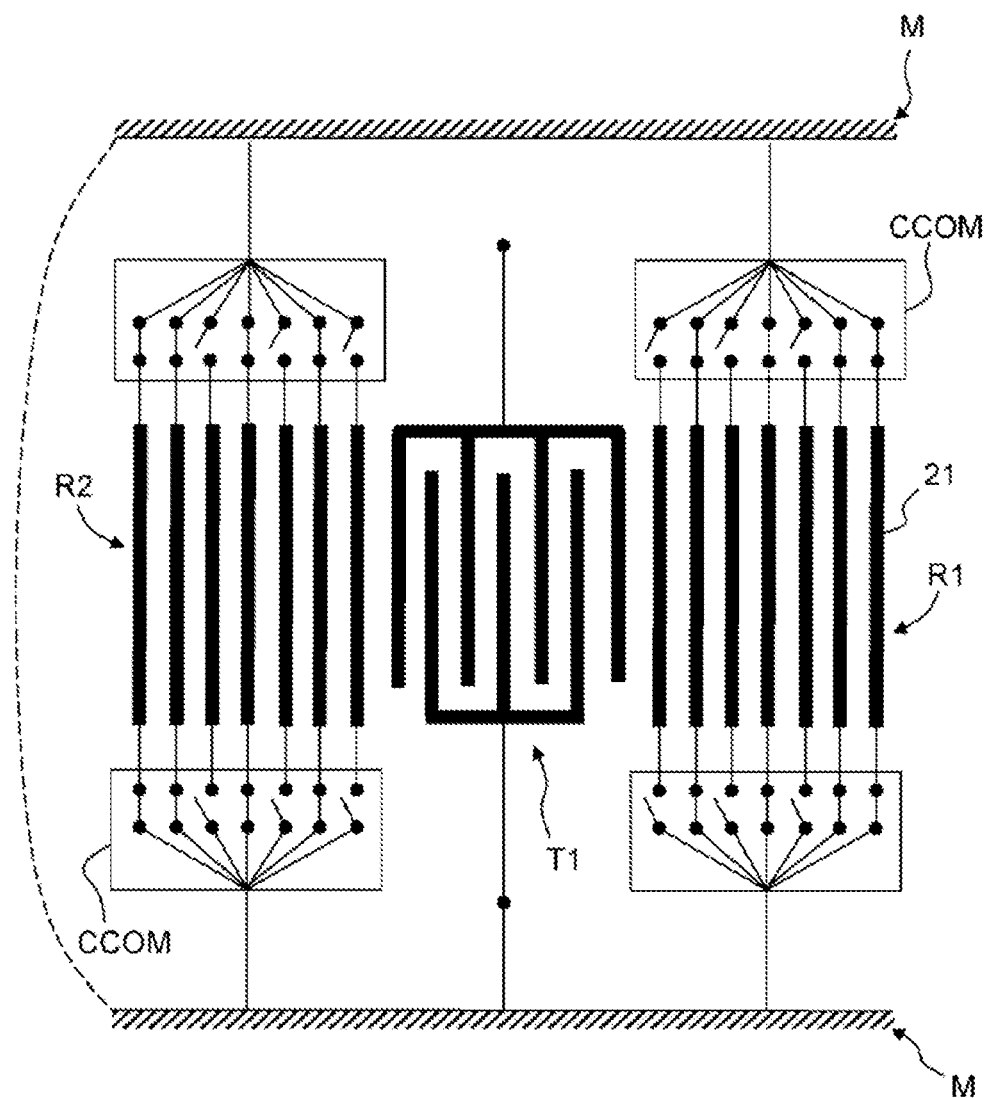
FIG. 3B illustrates a first embodiment of the device according to the invention in which electrodes are linked individually to the switching circuit so that the modification of connection of the electrodes is applied individually.

According to a first embodiment illustrated in FIG. 3B, electrodes are linked individually to the switching circuit so that the modification of connection of the electrodes is applied individually.

Figure 3C:
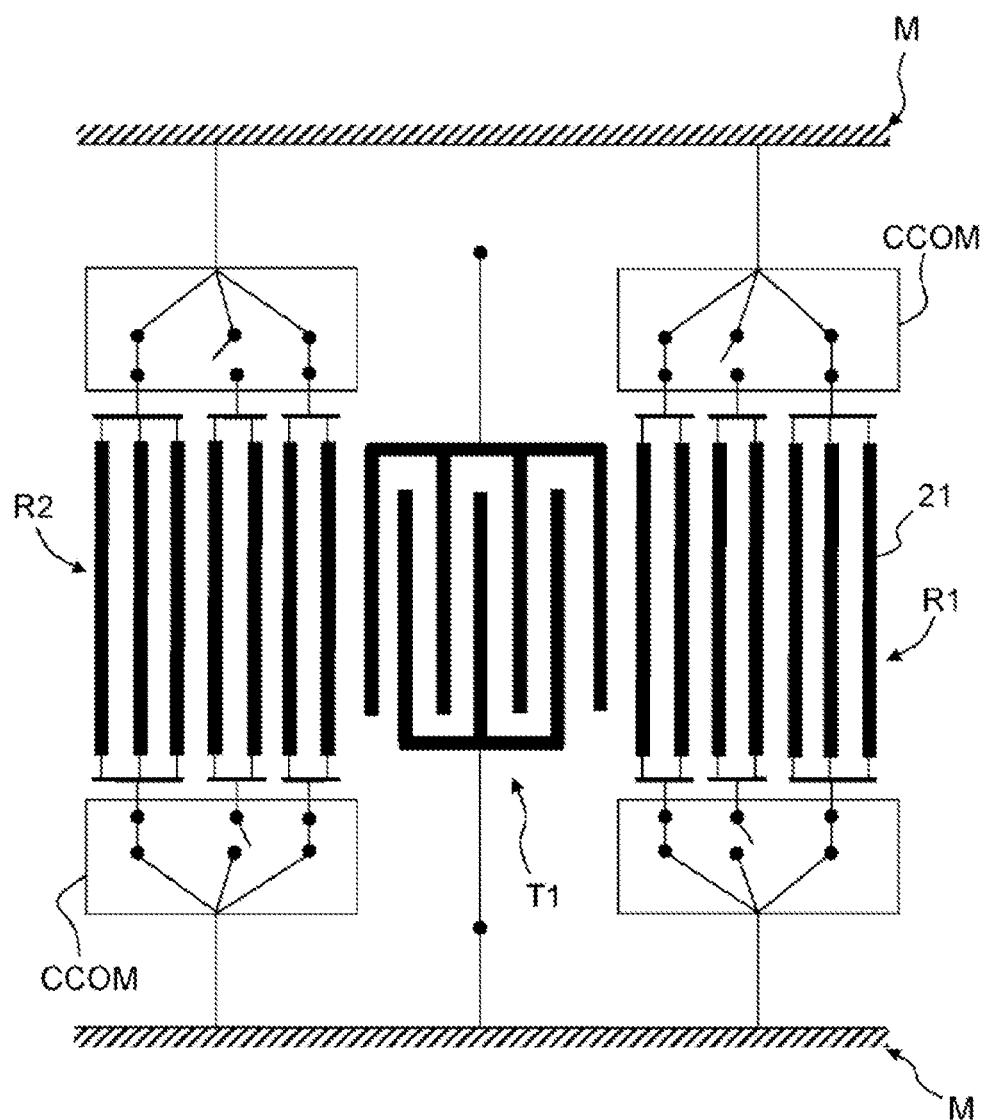
FIG. 3C illustrates a second embodiment of the device according to the invention in which electrodes are linked to one another to form bunches, each bunch being linked to the switching circuit so that the modification of connection of the electrodes is applied per bunch.

According to a second embodiment illustrated in FIG. 3C, electrodes are linked to one another to form bunches, each bunch being linked to the switching circuit so that the modification of connection of the electrodes is applied per bunch.

Hereinafter, for greater clarity, the frequency behavior of the device is explained without the presence of any switching circuits. For each array, this circuit or these circuits can connect all the electrodes or only a part of them, the others being connected directly to the ground or being simply unconnected and therefore not being reconfigurable.

To better understand the impact of this modification of the connection conditions of the electrodes of the mirrors on the behavior of an SAW, the inventors have introduced the concept of electrical stop band that will now be described.

In an infinite periodic structure, the scattering curves exhibit the variations of the frequencies of the acoustic waves which are propagated in the structure as a function of the number of waves k, for a given propagation direction. These curves make it possible to identify pass bands, frequency bands in which the waves are propagated and are characterized by a real number of waves k, and, under certain conditions, stop bands, frequency bands in which the waves are evanescent and are characterized by a complex number of waves k. In these frequency bands, there is no propagative mode in the mirror, and the reflection coefficient of the incident surface acoustic waves on this mirror can therefore take values close to unity (total reflection). Thus, in these frequency bands, the mirrors generally constitute good acoustic reflectors.

Figure 4:
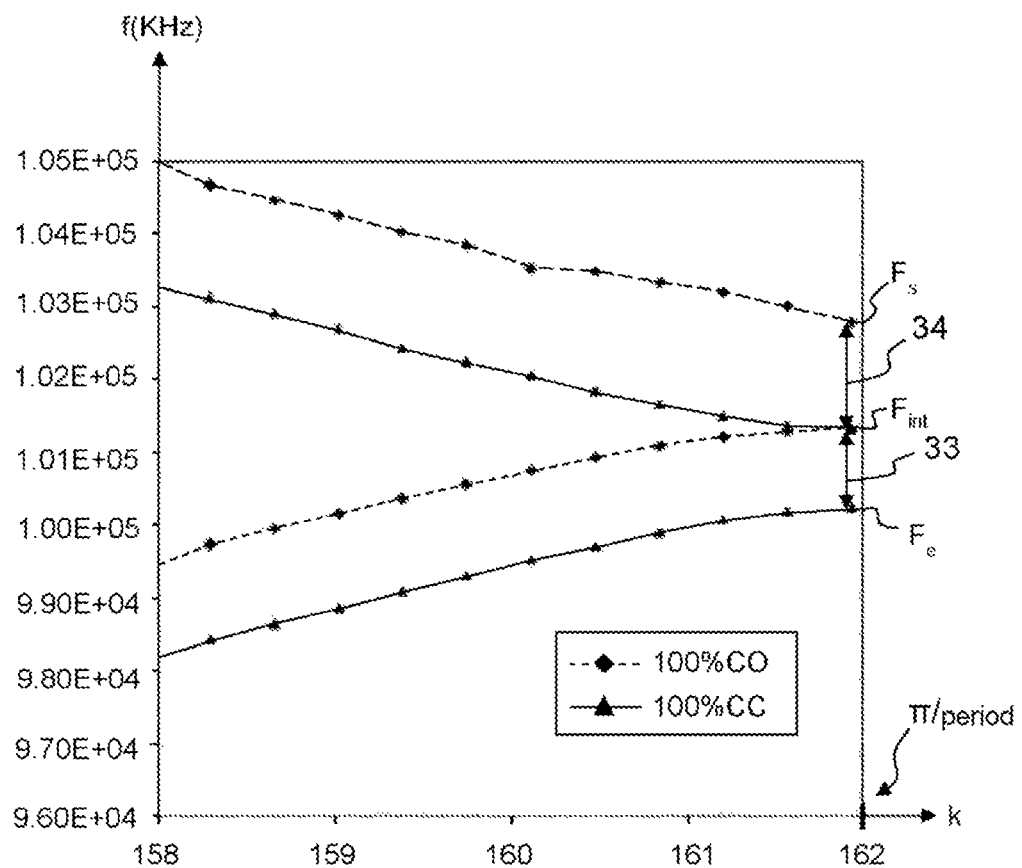
FIG. 4 illustrates the scattering curves characteristic of the mirrors for two different configurations of electrical boundary conditions imposed on each of the electrodes of these mirrors.

The inventors have shown that the modification of the connections of the electrodes of the mirrors had an impact on the stop band. FIG. 4 illustrates the characteristic scattering curves on the Brillouin zone up to $\pi/p$ (with p the spatial period of the array of electrodes) for the surface waves in the mirrors, for two different configurations of electrical boundary conditions imposed on each of the electrodes.

FIG. 4 has been calculated for the example of an $LiNbO_3$ (YXl)/128 substrate, comprising, on its surface, an array of electrodes made of aluminum of thickness h=400 nm, of width a=6.8 μm and of period p=19.4 μm (a/p=0.35). The direction of propagation is at right angles to the length of the electrodes.

The solid line corresponds to all the electrodes of the mirrors connected by short-circuit (100% CC), that is to say linked to the ground. A stop band 33 [Fe; Fint] is noted at $\pi/p$. This stop band 33 is narrow because phononic crystal can be considered as a quasi-homogeneous material with a zero potential on the surface.

The dotted line corresponds to all the electrodes of the mirrors left floating (100% CO). A greater stop band 34 [Fint; Fs] with upper limit Fs is noted at $\pi/p$.

These two stop bands 33 and 34 (connected to the ground or floating condition) are linked to the same geometry and to the same materials. They are differentiated only by the electrical boundary conditions imposed. That is why they are called electrical stop bands (BIE).

The relative widths of the electrical stop bands are linked to the electromechanical coupling coefficient associated with the surface wave being propagated in the piezoelectric substrate of the SAW structure.

Figure 5:
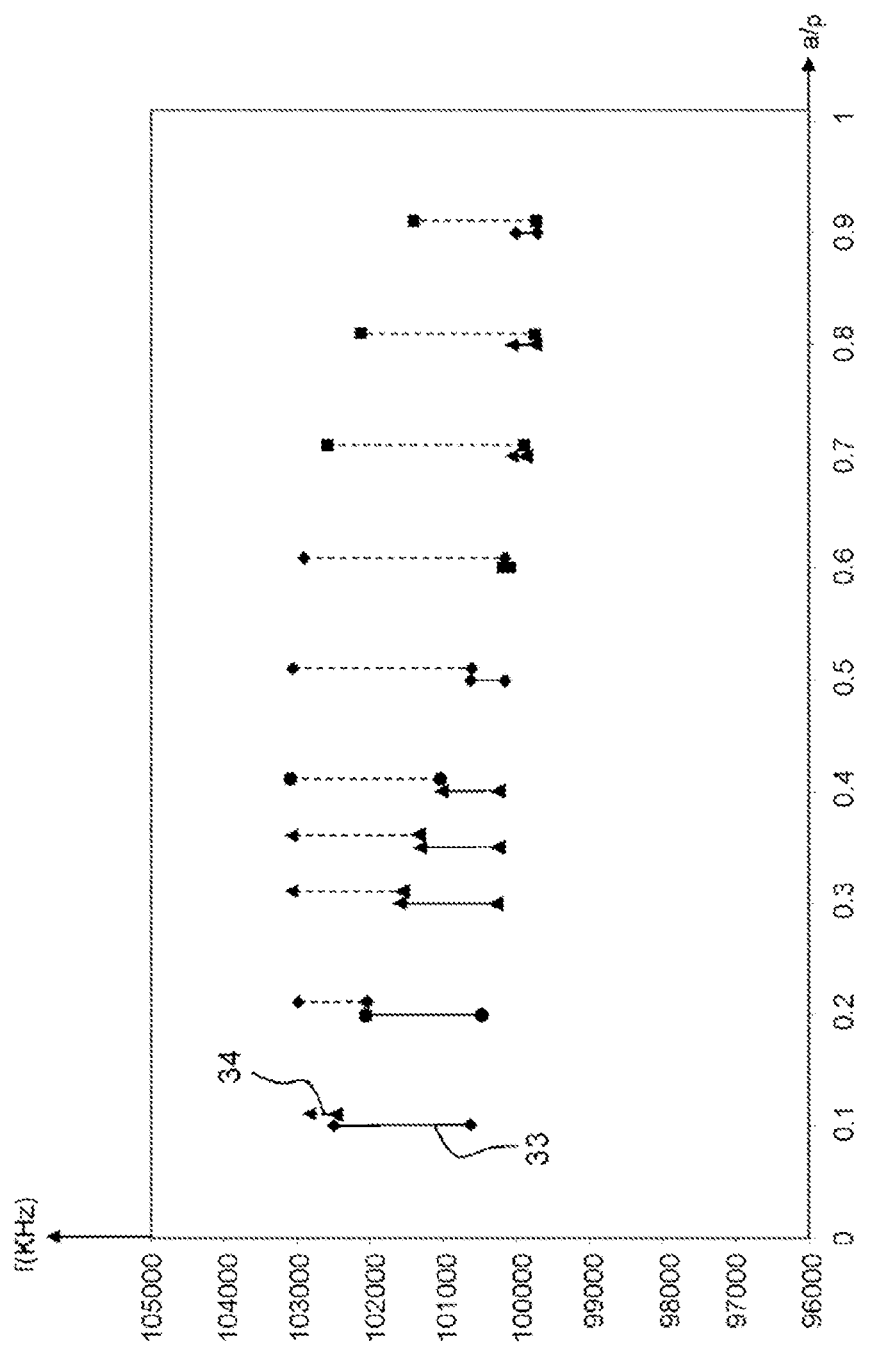
FIG. 5 illustrates the changes to stop bands for the two cases of 100% to the ground and 100% floating as a function of the a/p parameter of the electrodes of the mirrors.

FIG. 5 illustrates the changes to the stop bands 33 (100% CC) and 34 (100% CO) as a function of the a/p parameter (reference case: preceding example). It is found that, as a function of the ratio a/p between the size of the electrode a and the periodicity p, several situations can exist as a function of the electrical connection on the electrodes (connected to the ground or floating condition): stop bands which are superimposed, which are offset, which are widened, or which are reduced.

Figure 6:
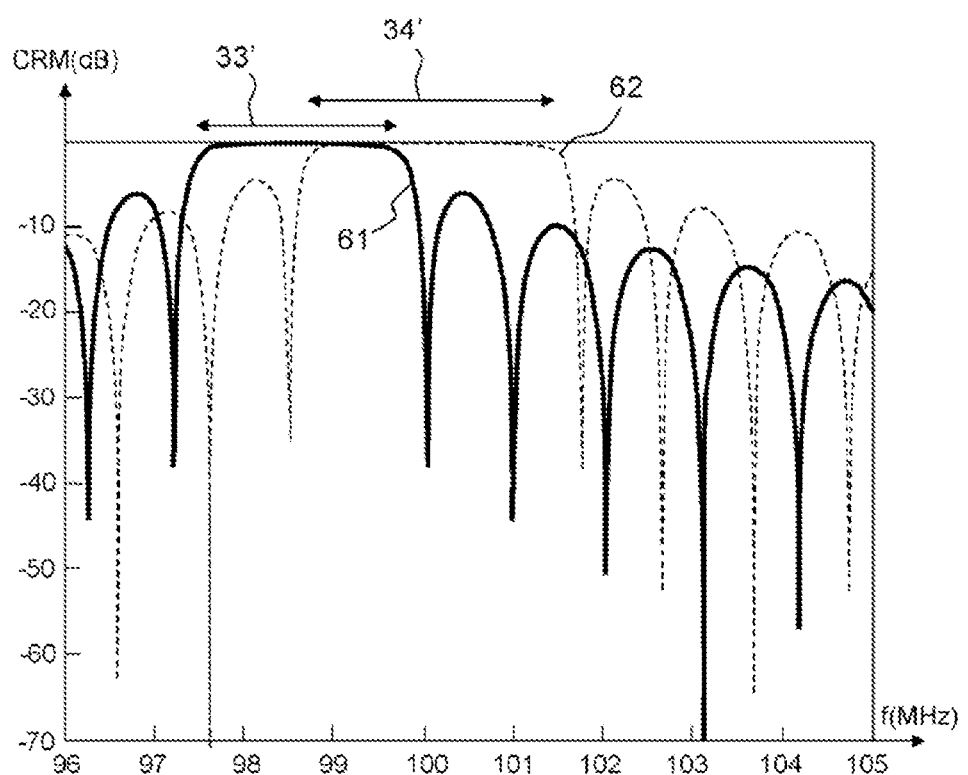
FIG. 6 illustrates the variations as a function of the frequency of the modulus of the simulated acoustic reflection coefficient of the mirrors for the two electrical boundary conditions applied to the electrodes of these mirrors.

The modification of the stop bands with the electrical condition imposed leads to a change of the reflection coefficient for the incident surface waves on the mirrors. FIG. 6 illustrates the variations as a function of the frequency of the modulus CRM of the simulated reflection coefficient of the mirrors when the electrical boundary condition applied to the electrodes is connected to the ground (100% CC), curve 61, or in floating condition (100% CO), curve 62, for an electrode thickness h of 200 nm, a period p of 19.4 µm, a width a=6.8 µm, and a substrate material made of LiNbO3, cut (YXI)/128.

It is noted that the frequency bands 33' and 34' in which the reflection is equal to 1 (0 dB) are close to the stop bands presented in FIG. 4, a little offset because of the change of thickness of the electrodes. The two reflection bands are offset and contiguous. Thus, the acoustic reflection bands of the mirrors can be controlled electrically.

This modification of the reflection coefficient of the mirrors has a direct impact on the frequency behavior of an SAW produced with the mirrors.

Figure 7:
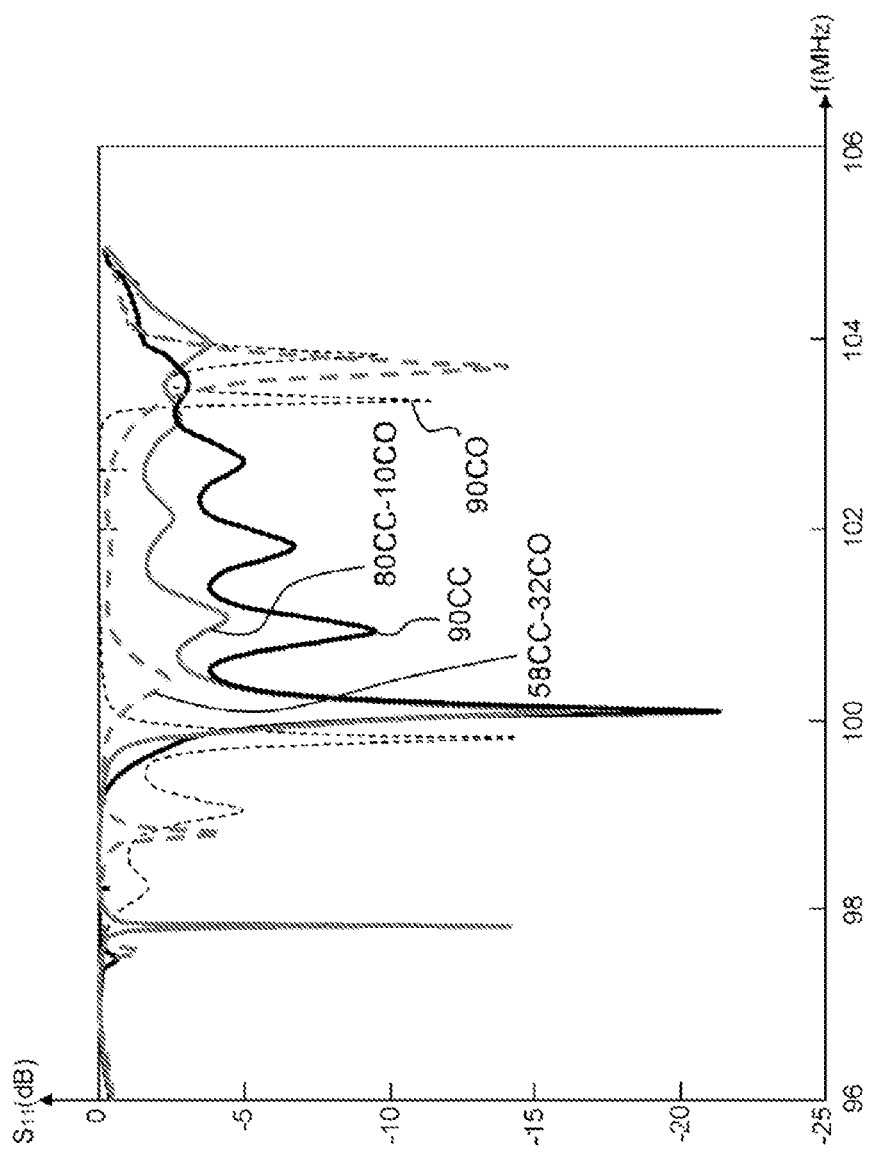
FIG. 7 presents the variations as a function of the frequency of the electrical parameter S11 of the resonator when the conditions on the mirrors are modified according to four different configurations.

Consider now a single-port resonator comprising a transducer T1 and the two Bragg mirrors previously studied on either side (see FIG. 3). Each of the mirrors comprises an array of 90 electrodes and have an a/p of 0.35, the central transducer comprises 48 electrodes with an a/p of 0.45. The electrical energy reflected by the resonator is associated with the square of the parameter S11. FIG. 7 presents the variations of the parameter S11 of the resonator as a function of the frequency, when the conditions on the mirrors are modified according to four configurations:

90 electrodes CC (connected to the ground)
90 electrodes CO (floating)
58 electrodes CC—32 electrodes CO
80 electrodes CC—10 electrodes CO In the last two configurations, the 32 OR 10 electrodes set to floating conditions are those close to the transducer T1.

The minima of the parameter S11 correspond to elastic resonances of the transducer+mirrors set for which a greater quantity of the incident electrical energy is transformed into mechanical energy.

When all the electrodes of the mirrors are connected to the ground, a main resonance is noted at 100 MHz.

When all the electrodes of the mirrors are in floating condition, this resonance is modified little by the changing of the electrical boundary conditions, but more resonances with strong quality coefficient are seen to appear. The curve with all the electrodes in floating condition for the mirrors highlights the multimodal nature of the single-port resonator.

The other two curves correspond to two intermediate situations with the electrodes of the mirrors close to the transducer set little-by-little to floating condition.

The potential of the device according to the invention, which can have, for identical geometrical parameters, a frequency behavior that is differentiated by virtue of the connection configuration of the electrodes of the mirrors, can be seen.

Preferentially, the distribution of the connection of the electrodes between the different types of connections is symmetrical with respect to the transducer or transducers. That facilitates the simulations and makes the selection in terms of acoustic frequency more accurate.

Preferentially, the connection to the ground is made at both ends of each electrode 21. That allows the top ground plane to be connected to the bottom ground plane, thus ensuring the continuity of the ground.

By virtue of the device according to the invention, the electrical boundary conditions of the mirrors are modified in order to modify the operating frequency of the resonator, without changing the characteristics of the device (substrate material, geometrical parameters, etc.), and while preserving the integrity of the filtering function.

The standard operation of the device 10 of the invention in the configuration with two ports is directly of filter type. The concept of the invention can also be expanded to the SAW filters referred to as cascade SAW filters. In this case, a filter is produced using a plurality of surface acoustic wave devices 10 according to the invention with a single port, associated electrically according to a series and/or parallel arrangement. As is known, the combination of different SAWs makes it possible to produce a filter conforming to a determined specification, by controlling the form of the strip of the filter (that preferentially is desired to have steep flanks), its width, its nominal frequency, etc.

Figure 2:
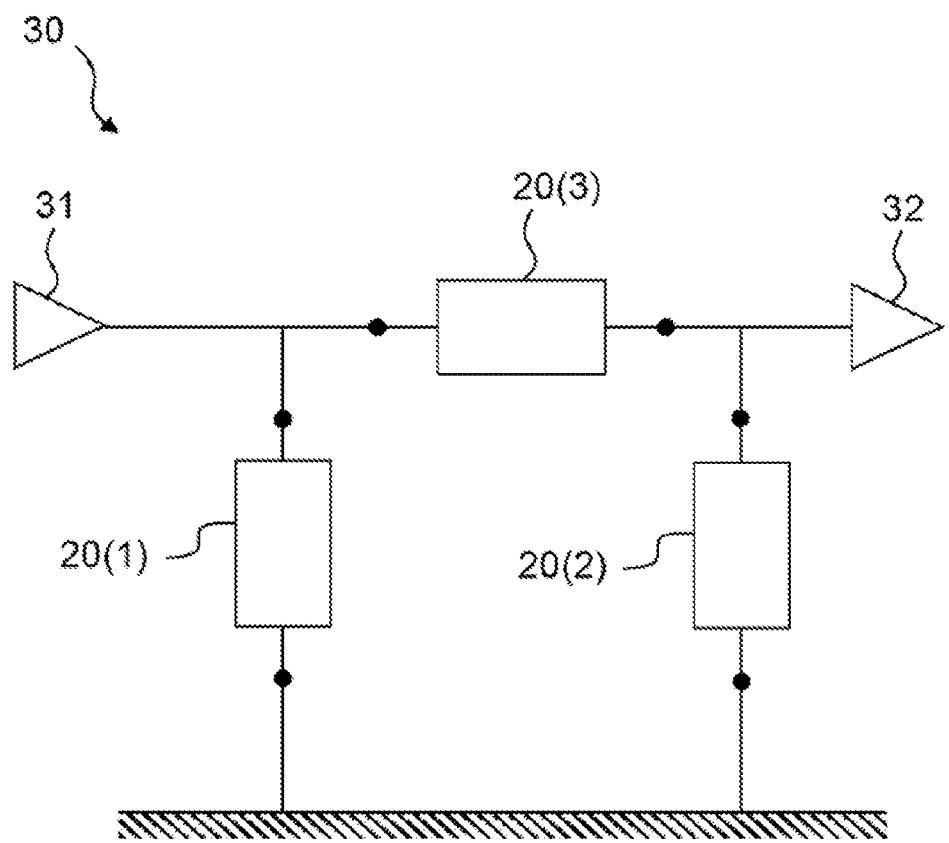
FIG. 2, already cited, illustrates an arrangement of elementary SAWs in a ladder filter configuration according to the state of the art.

FIG. 7b is illustrates the performance of a complex filter in a ladder configuration as illustrated in FIG. 2, but in which the SAWs according to the state of the art have been replaced by SAWs according to the invention.

The two devices in parallel (equivalent of 20(1) and 20(2)) are identical, single-port, and produced from the same transducer T1 with the following characteristics:

T1: 18 pairs of electrodes, p=19.1 µm, a/p=0.3, h=0.17 µm
The array of each mirror has 60 electrodes, with p=19 µm, a/p=0.4, h=0.17 µm.

The device in series (equivalent of 20(3)) is also single-port and produced from the transducer T1' with the following characteristics:

T1': 11 pairs of electrodes, p=18.5 µm, a/p=0.5, h=0.17 µm
The array of each mirror has 60 electrodes, with p=19.2 µm, a/p=0.4, h=0.17 µm.

The four curves 70 to 73 illustrate the theoretical transmission of the ladder filter via its parameter $S_{12}$ as a function of the frequency f for different connection configurations of the electrodes of the mirrors.

The curve 70 corresponds, for the three devices, to the 60 electrodes connected to the ground.

The curve 71 corresponds, for the three devices, to 55 electrodes connected to the ground (CC) and the 5 electrodes closest to the transducer open-circuit (CO).

The curve 72 corresponds, for the three devices, to 50 electrodes CC and the 10 electrodes closest to the transducer CO.

The curve 73 corresponds, for the three devices, to 40 electrodes CC and the 20 electrodes closest to the transducer CO.

It is found that a band pass filter has indeed been produced, the different connection configurations resulting in an offset of the nominal frequency of the filter of approximately 1 MHz without degradation of the other figures of merit of the filter.

Furthermore, the production of a complex filter from one and the same elementary filter 10 according to the invention (same geometrical parameters) facilitates the manufacturing thereof.

It also becomes possible to perform, post-manufacture, adjustments of specification, by locally modifying the type of connection of selected electrodes.

Figure 8:
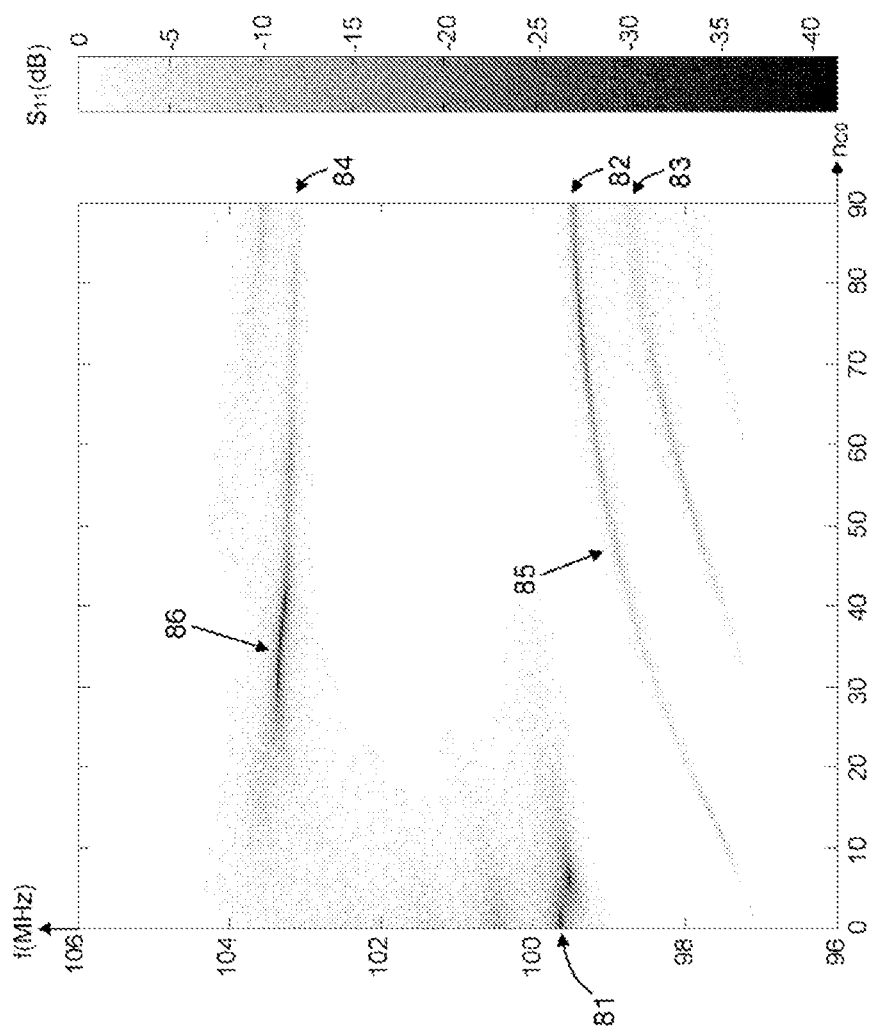
FIG. 8 presents, in levels of gray, the variations of the parameter S11 of the single-port resonator as a function on the one hand of the number $n_{CO}$ of the electrodes in floating condition (from 0 to 90) and, on the other hand, as a function of the frequency.

FIG. 8 presents, in levels of gray, the variations of the parameter S11 of the single-port resonator as a function of the frequency and of the number nCO of the electrodes in floating condition (from 0 to 90).

The dark zones correspond to resonances. This figure is rich in information:

- when all the electrodes of the mirrors are connected to the ground ($n_{CO}$=0), a resonance is found at 100 MHz, see 81.
- when all the electrodes of the mirrors are in floating condition ($n_{CO}$=90), a resonance is found around 99.8 MHz (see 82), as well as other, lower resonances (around 99 MHz—see 83) and higher resonances (around 103 MHz—see 84), highlighting the multi-modal nature of the device.
- when few electrodes are in floating condition ($n_{CO}$<10), a weak variation of the resonance (of a few kHz around the central frequency at 100 MHz) is observed. This is a continuous but weak agility of the main resonance (see 81).
- from 5-10 electrodes and up to 90 electrodes in floating condition, a resonance is observed which changes continuously from 97.3 MHz to 99.8 MHz (see 85). The relative variation is 2.5%, this is a continuous agility of a secondary resonance over a wide band. This secondary resonance represents the stop band input frequency of the device: all along the changing of the number of electrodes in floating potential.
- when approximately 30 to 40 electrodes are in floating condition, a pronounced resonance is observed around 103.5 MHz (see 86). The setting of these electrodes to floating condition can be seen as a jump in the main frequency of the resonator. A frequency switching function is produced here.

According to one embodiment, for each array, the connections of the electrodes are made individually, as illustrated in FIG. 3. According to a first example, the individual connections are made for all of the electrodes via a switching circuit, as illustrated in FIG. 3B, and, according to a second example, the individual connections are made for only a part via a switching circuit.

Figure 9A:
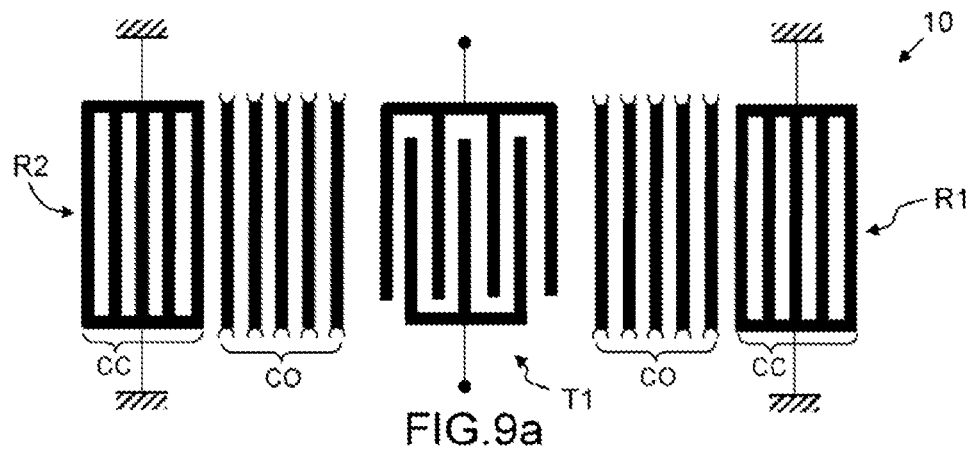
FIGS. 9a, 9b and 9c illustrate an embodiment of the invention in which, for each array, electrodes are linked to one another defining bunches, the connection being made per bunch.
Figure 9B:
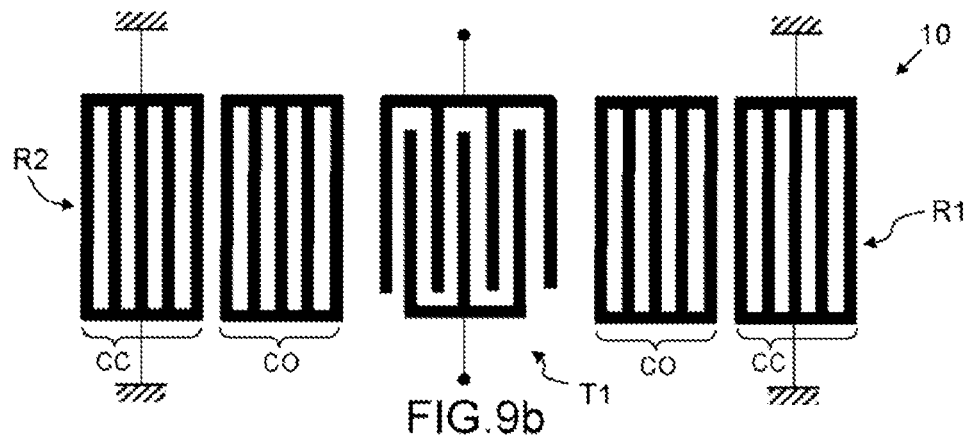

According to another embodiment illustrated in FIG. 3C and FIGS. 9a, 9b and 9c, for each array, electrodes are linked to one another defining bunches, the connection being made by bunch. FIG. 9a illustrates a connection by bunch of the electrodes to the ground, and FIG. 9b illustrates floating electrodes also linked to one another. The inventors have shown that these bunches of floating electrodes also have an effect as described above, but one that is slightly different. According to a first example, the connections by bunch of the electrodes are made for all of the electrodes via a switching circuit, as illustrated in FIG. 3C, and, according to a second example, the connections by bunch are made for only a part via a switching circuit. The two embodiments can of course be combined, certain connections being made by bunch and others individually, via a switching circuit or not.

Figure 9C:
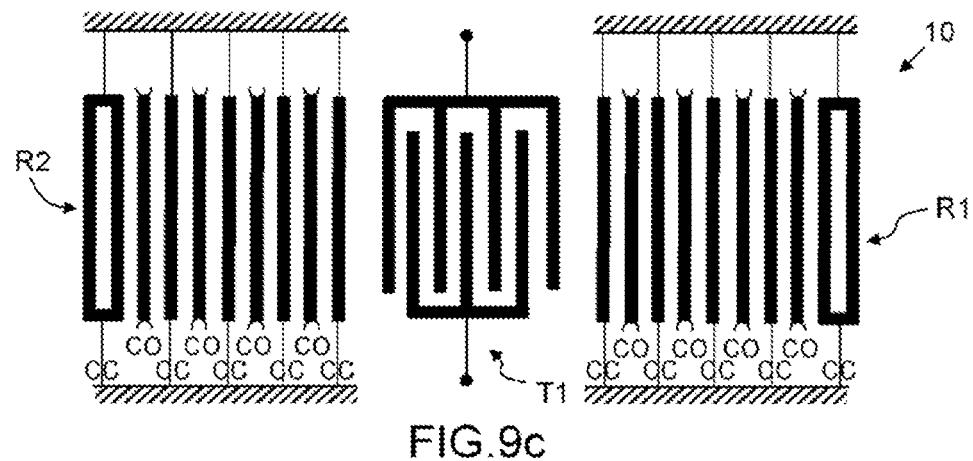

FIGS. 9a, 9b and 9c also illustrate different examples of arrangement of the two types of connection which can be combined together.

In FIGS. 9a and 9b, for each array, a subset of neighboring electrodes disposed at one end of the array (here that opposite the transducer) is connected to the ground.

Also in FIGS. 9a and 9b, for each array, a subset of neighboring electrodes disposed at one end of the array (here that on the side of the transducer) has a floating connection.

In FIG. 9c, for each array, there is a "homogeneous" block of two CC (end on the side opposite the transducer) and there are several successive electrodes that have an alternation of connections to the ground CC and that are floating CO. FIG. 9c illustrates an array including a periodic pattern of connections of electrodes of type 1 CC/1 CO, but of course other types of periodic patterns are possible, such as 1 CC/2 CO or 1 CC/3 CO. Thus, according to this embodiment, for each array, electrodes form a periodic pattern, a pattern comprising at least one electrode connected to the ground and one electrode floating.

The use of a periodic pattern with several connections also allows electrical stop bands to be opened to fractional frequencies nF/N, where F is the initial operating frequency of the resonator, N is the number of electrodes in a pattern, and n is an integer. Thus, by way of example, in the case of the double period, if one electrode in every two is connected to the ground and one electrode in every two is in floating condition, the electrical stop band at the operating frequency of the resonator remains and additional electrical stop bands appear at the half-frequency with the same relative width and at 1.5 times the frequency. These observations are generalized for triple, quadruple, etc. periods. It is therefore possible, by simple modification of the electrical boundary conditions of the mirrors, to obtain fractional operating frequencies.

Generally, the electrical connections by group or based on a periodic pattern make it possible to increase the possibilities offered by the device according to the invention.

Figure 10:
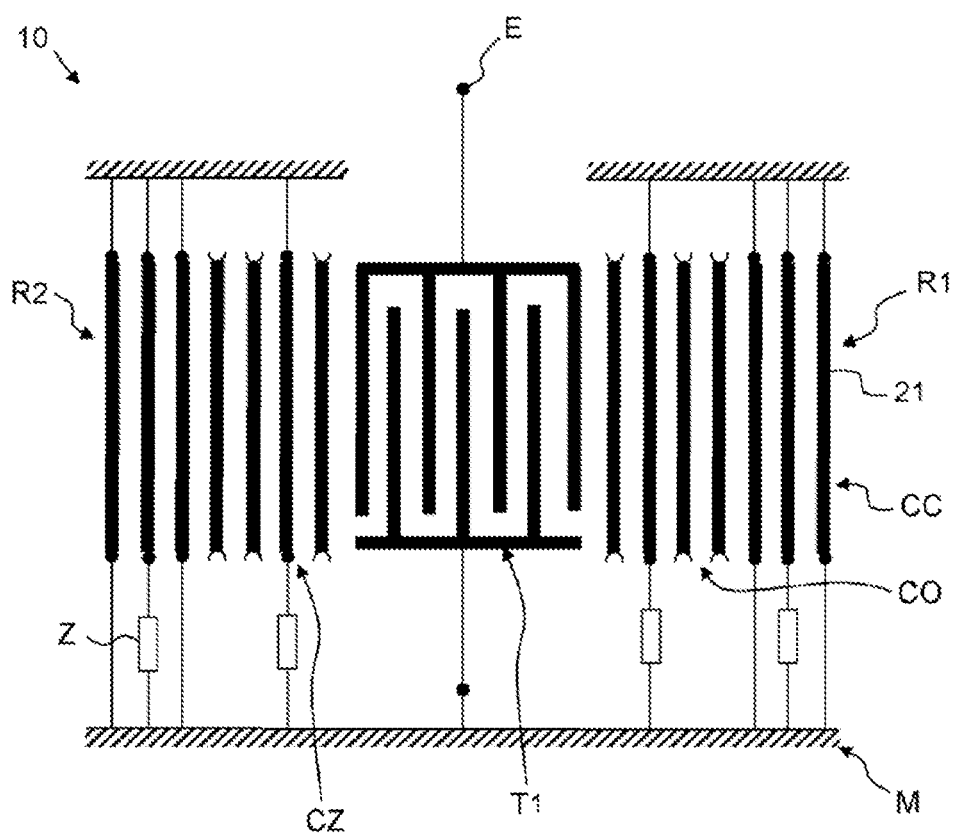
FIG. 10 illustrates a second variant of the device according to the invention in which, for at least one subset of the electrodes of each mirror, an impedance Z is introduced between each of the electrodes of the subset and the ground, defining a third type of connection CZ.

According to a second variant of the device 10 according to the invention illustrated in FIG. 10, for at least one subset of the electrodes of each mirror, an impedance Z is introduced between each of said electrodes of the subset and the ground, defining a third type of connection CZ. This third type of connection makes it possible to broaden design possibilities of the filter by engineering of the electrical stop band, by introducing an entire set of intermediate cases between the CO condition (equivalent to an infinite impedance between the electrode and the ground) and the CC condition (equivalent to a zero impedance between these same two points). The main point of what has been described previously remains true with three types of connection. The impedance Z, moreover, may be of conventional R, L or C type, or more complex, such as a negative capacitance. This can be a passive or active circuit (external capacitance: positive or negative, variable inductances). This third type of connection can be implemented with a connection to the ground made directly or made via a switching circuit.

The switching circuit or circuits of the device 10 according to the invention produce a dynamic reconfiguration of the distribution of the types of connections of the electrodes of the mirrors, which allows for a modification, possibly real-time, of the frequency characteristics of the filter, such as its nominal frequency. By taking up the teaching of FIG. 8, it is found that, as a function of the different connection configurations of selected electrodes, the device according to the invention offers several types of agility:

(1) a continuous but weak agility of the operating frequency (a few per thousand of the operating frequency),
(2) a continuous and notable agility of the operating frequency (a few percent of the operating frequency),
(3) a jump in the operating frequency (a few percent of the operating frequency),
(4) the use of the device at fractional operating frequencies if the transducer of the device is wide band.

The working speed of the circuit or circuits CCDM is either slow, for example to make an adjustment of the filter after a temperature measurement, or rapid (one to a few switches per microsecond) for example for telecom or military applications.

The circuits CCDM are, for example, microswitches based on microelectrical mechanical elements in the RF domain (RF-MEMs).

The coupling of the RF-MEMS and of the SAWs makes it possible to control the type of connection of each electrode. Other switching systems, for example based on FET transistors, on diodes, on low capacity MOS, are possible. Switches based on electronic circuits make it possible to dispense with the duality of connection to the ground/floating condition by making connections of CZ type.

The frequency agility also allows the bulk of the filtering devices to be reduced and energy consumption to be reduced.

Figure 11:
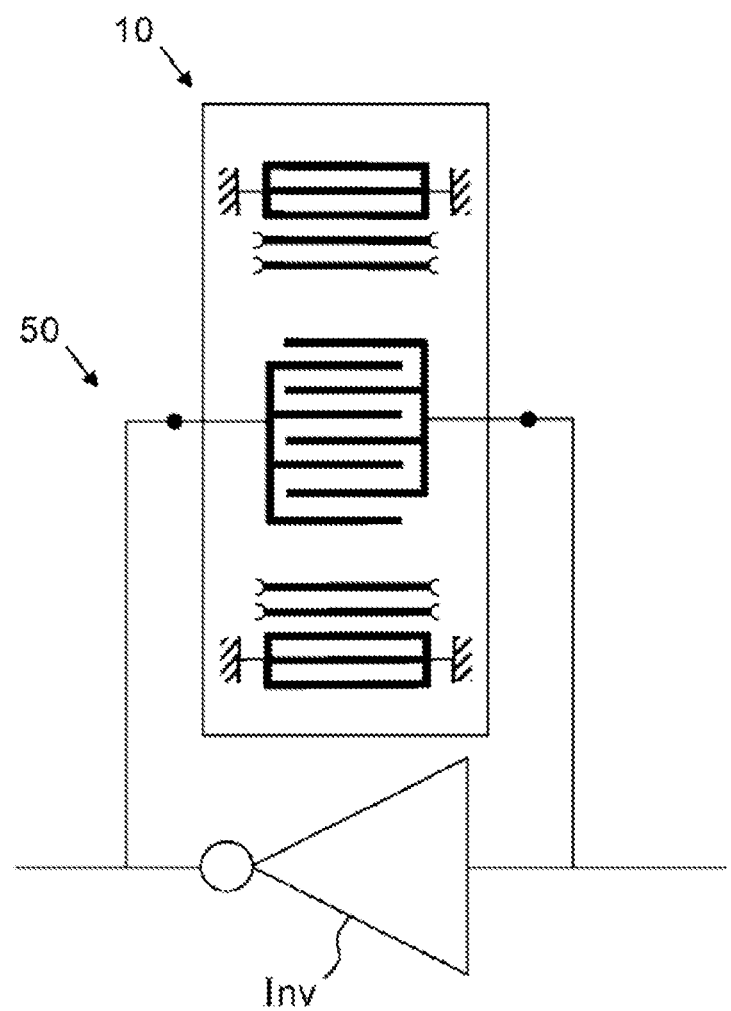
FIG. 11 illustrates an oscillator that is stabilized in frequency by a device according to the invention.

According to another mode of operation, the device according to the invention makes it possible to produce an oscillator. Thus, according to another aspect, the invention relates to an oscillator 50 as illustrated in FIG. 11 comprising an inverting circuit Inv and a surface acoustic wave device 10 according to the invention arranged in parallel with said inverting circuit. For this application, the device 10 must have two transducers defining an input and an output. The oscillator thus produced will oscillate on the frequency defined by the surface wave device.

The invention claimed is:

1. A frequency-agile surface acoustic wave device comprising:
    at least one transducer (T1, T2),
    two acoustic reflectors (M1, M2) disposed on either side of the at least one transducer so as to form a cavity, each acoustic reflector comprising an array of electrodes (R1, R2) in the form of rows that are parallel to one another, each array comprising a subset of electrodes connected to a reference potential denoted ground (M) defining a first type of connection (CC), and a subset of electrodes which are not connected to any potential, that is to say which have a floating connection defining a second type of connection (CO),
    at least one switching circuit (CCOM) configured to modify the distribution of the connections of at least a part of the electrodes of each array between the different types of connection.

2. The surface acoustic wave device as claimed in claim 1, comprising one or two transducers.

3. The surface acoustic wave device as claimed in claim 1, wherein each electrode can have only the first (CC) or the second (CO) type of connection.

4. The surface acoustic wave device as claimed in claim 1, further comprising, for at least one subset of the electrodes of each mirror, an impedance (Z) between each of said electrodes of said subset and the ground, defining a third type of connection (CZ).

5. The surface acoustic wave device as claimed in claim 1, wherein the distribution of the connections of the electrodes between the different types is symmetrical with respect to the at least one transducer.

6. The surface acoustic wave device as claimed in claim 1, wherein, for each array, connections of the electrodes are made individually.

7. The surface acoustic wave device as claimed in claim 1, wherein, for each array, electrodes are linked to one another defining bunches, the connection being made per bunch.

8. The surface acoustic wave device as claimed in claim 1, wherein, for each array, a subset of neighboring electrodes disposed at one end of the array is connected to the ground.

9. The surface acoustic wave device as claimed in claim 1, wherein, for each array, a subset of neighboring electrodes disposed at one end of the array has a floating connection.

10. The surface acoustic wave device as claimed in claim 1, wherein, for each array, electrodes form a periodic pattern, a pattern comprising at least one electrode connected to the ground and a floating electrode.

11. The surface acoustic wave device as claimed in claim 1, wherein, for each array, electrodes are linked individually to the switching circuit so that the modification of connection of said electrodes is applied individually.

12. The surface acoustic wave device as claimed in claim 1, wherein, for each array, electrodes are linked to one another to form bunches, each bunch being linked to the switching circuit so that the modification of connection of the electrodes is applied per bunch.

13. A frequency filter comprising a surface acoustic wave device as claimed in claim 1.

14. A frequency filter comprising a plurality of surface acoustic wave devices as claimed in claim 1 arranged in series and/or in parallel.

15. An oscillator comprising an inverting circuit (Inv) and a surface acoustic wave device as claimed in claim 1 arranged in parallel with said inverting circuit, the surface acoustic wave device comprising two transducers.

\* \* \* \* \*